(12) United States Patent
Coolbaugh et al.

(10) Patent No.: US 6,420,747 B2
(45) Date of Patent: *Jul. 16, 2002

(54) MOSCAP DESIGN FOR IMPROVED RELIABILITY

(75) Inventors: Douglas Duane Coolbaugh, Essex Junction; James Stuart Dunn, Jericho; Peter John Geiss, Underhill; Douglas Brian Hershberger; Stephen Arthur St. Onge, both of Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,275

(22) Filed: Feb. 10, 1999

(51) Int. Cl.$^7$ ............................................. H01L 27/108
(52) U.S. Cl. ..................... 257/296; 257/532; 257/411
(58) Field of Search ............................... 257/411, 532, 257/409, 296, 516

(56) References Cited

U.S. PATENT DOCUMENTS

| | | | |
|---|---|---|---|
| 3,597,667 A | * 8/1971 | Horn | 317/235 |
| 3,865,649 A | 2/1975 | Beasom | 148/187 |
| 4,001,869 A | 1/1977 | Brown | 357/51 |
| 4,212,100 A | * 7/1980 | Paivinen et al. | 59/571 |
| 4,214,252 A | 7/1980 | Goerth | 357/23 |
| 4,295,264 A | 10/1981 | Rogers | 29/571 |
| 4,639,274 A | 1/1987 | Krishna | 148/1.5 |
| 4,737,830 A | 4/1988 | Patel et al. | 357/23.6 |
| 4,758,873 A | 7/1988 | Monticelli | 357/51 |
| 4,929,989 A | 5/1990 | Hayano | 357/23.6 |
| 5,006,480 A | 4/1991 | Chang et al. | 437/47 |
| 5,264,723 A | 11/1993 | Strauss | 257/532 |
| 5,296,734 A | 3/1994 | Satoh | 257/638 |
| 5,341,009 A | 8/1994 | Young et al. | 257/296 |
| 5,525,533 A | 6/1996 | Woodruff et al. | 437/60 |
| 5,565,699 A | 10/1996 | Kaneko et al. | 257/379 |
| 5,608,258 A | * 3/1997 | Rajkanan et al. | 257/532 |
| 5,643,820 A | 7/1997 | Williams et al. | 437/60 |
| 5,650,645 A | 7/1997 | Sone et al. | 257/288 |
| 5,739,052 A | 4/1998 | Krishnan et al. | 438/17 |
| 5,793,074 A | * 8/1998 | Choi et al. | 257/296 |
| 6,087,696 A | * 7/2000 | Li et al. | 257/411 |

* cited by examiner

*Primary Examiner*—Mark V. Prenty
(74) *Attorney, Agent, or Firm*—Scully, Scott, Murphy & Presser; Mark F. Chadurjian

(57) ABSTRACT

Reliable metal oxide semiconductor (MOS) devices which exhibit little or no oxide breakdown at the $R_x$ edge during device biasing are provided. The improved reliability is obtained by forming a contact to the polysilicon top conductor over a substantially thicker portion of the dielectric region. A method of fabricating the improved CMOS devices is also disclosed herein.

15 Claims, 5 Drawing Sheets

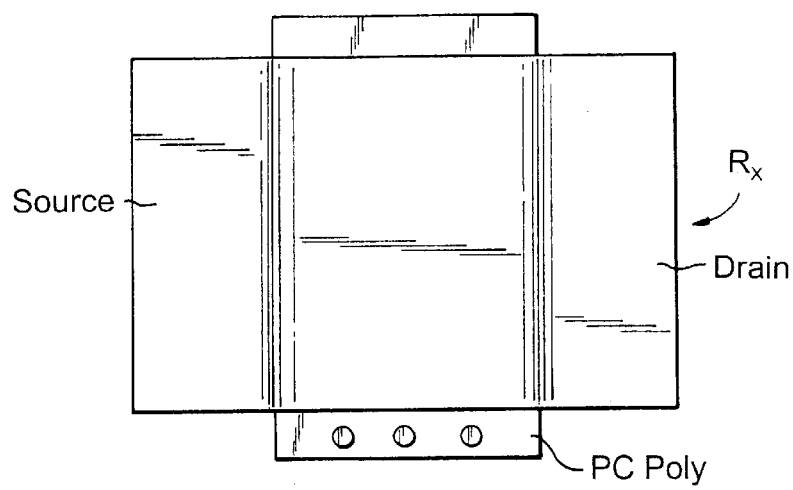
FIG. 2
Prior Art
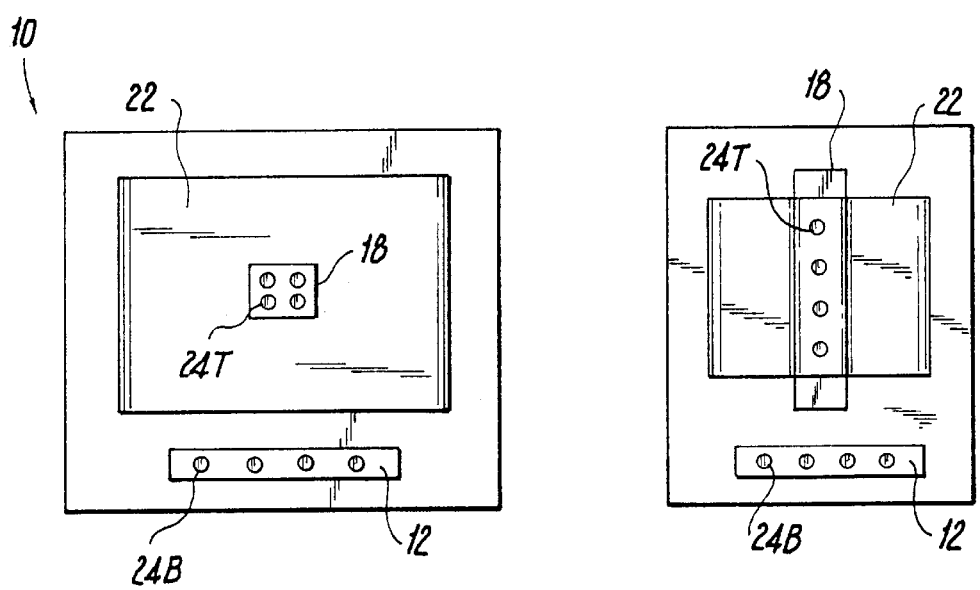
FIG. 3(a)     FIG. 3(b)

MOSCAP DESIGN FOR IMPROVED RELIABILITY

FIELD OF THE INVENTION

The present invention is directed to metal oxide semiconductor (MOS) devices such as metal oxide semiconductor capacitors (MOSCAPs), complementary metal oxide semiconductor (CMOS) field effect transistors (FETs) and bipolar transistors such as lateral pnp devices, and in particular to an improved design for MOS devices which enhances the reliability of the same. The MOS devices of the present invention have improved reliability since substantially little or no oxide breakdown at the $R_x$ corner or edge occurs during device biasing.

BACKGROUND OF THE INVENTION

A major factor that inhibits prior art MOS devices such as MOSCAPs is the overlap of the gate polysilicon and the $R_x$ edge of the semiconducting substrate. The term "$R_x$ edge" is used herein to denote the area of the semiconducting material which is bounded by the shallow trench isolation (STI) region. A typical prior art MOSCAP structure is shown in FIGS. 1(a)–(b). Specifically, FIG. 1(a) is a top view of a prior art MOSCAP structure, whereas FIG. 1(b) is a cross-sectional view of the same structure. In such structures, the shallow trench isolation (STI) corner or $R_x$ edge region (hereinafter referred to as just the $R_x$ edge) becomes an emitter of hot electrons when the base plate becomes negatively biased. These hot electrons degrade the oxide reliability.

The above overlap problem is not something that can be typically avoided since the prior art requires the same for eliminating the possibility of damaging the gate oxide when contacting the gate polysilicon with a metal contact.

For STI designs, the contact problem is alleviated by placing the gate polysilicon over the $R_x$ edge so that the gate can be contacted over the trench oxide. This design, however, results in a less reliable MOSCAP structure due to the high electrical field formed at the $R_x$ edge when the bottom plate of the MOSCAP is biased negative. The resulting device is thus unreliable due to a greater potential for oxide breakdown at the $R_x$ edge.

FIG. 2 shows another prior art MOS device. Specifically, FIG. 2 illustrates a top view of a prior art field effect transistor (FET) design. In this figure, the gate polysilicon also overlaps the $R_x$ edge; therefore the above problem exists for this prior art FET design as well.

In view of the above mentioned drawback with prior art MOS designs, there is a need for a new MOS device which eliminates the overlap of the gate polysilicon with the $R_x$ edge of the device. Such a design would allow for fabricating MOS devices which have a greater reliability than those currently be used.

SUMMARY OF THE INVENTION

One object of the present invention is to provide a highly reliable MOS device which eliminates the thin oxide areas over STI corners, i.e. the $R_x$ edge.

Another object of the present invention is to design a MOS device which provides a solution for contacting the gate polysilicon over an $R_x$ structure.

A further object of the present invention is to design a MOS device which has improved series resistance to the doped gate region of the device.

These and other objects and advantages are met by utilizing a MOS device which comprises: a semiconducting substrate; a first doped region formed in said semiconducting substrate; a dielectric region formed on said first doped region, wherein said dielectric region has a substantially thicker portion comprising a nitride pad formed over a screen oxide layer; a gate region formed over said dielectric region, said gate region being doped with a n- or p-type dopant; and an electrical contact connected directly to said gate region over the substantially thicker portion of said dielectric region.

The term "MOS device" is used herein to denote MOSCAP devices, FET devices, bipolar transistors such as lateral pnp devices as well as other MOS devices which contain a gate region for controlling the device.

Another aspect of the present invention relates to a method of fabricating the above described MOS devices. Specifically, the method of the present invention comprises the steps of:

(a) providing a MOS structure, said structure comprising a semiconducting substrate having a screen oxide formed on a portion of said semiconducting substrate;

(b) implanting a first impurity region in said semiconducting substrate using said screen oxide as an implantation mask;

(c) forming a nitride pad on said screen oxide;

(d) removing portions of said nitride pad and said screen oxide, but leaving a stack region of said nitride pad and said screen oxide on said semiconducting substrate;

(e) forming a dielectric layer abutting said stack region so as to form a dielectric region having a substantially thicker portion;

(f) forming a gate region over said dielectric region;

(g) patterning said gate region and said dielectric region so as to provide a structure having said gate region over said substantially thicker portion of said dielectric region;

(h) doping said patterned gate region with a n- or p-type dopant; and (i) forming metal contacts on said doped gate region over said substantially thicker portion and over said first doped region.

In one embodiment of the invention, step (h) occurs before the patterning step, i.e. between steps (f) and (g).

BRIEF DESCRIPTION OF THE DRAWINGS

FIG. 2 is a prior art FET design.

FIGS. 3(a)–(b) are top views of MOSCAP devices of the present invention; whereas

DETAILED DESCRIPTION OF THE INVENTION

Figure 1A:
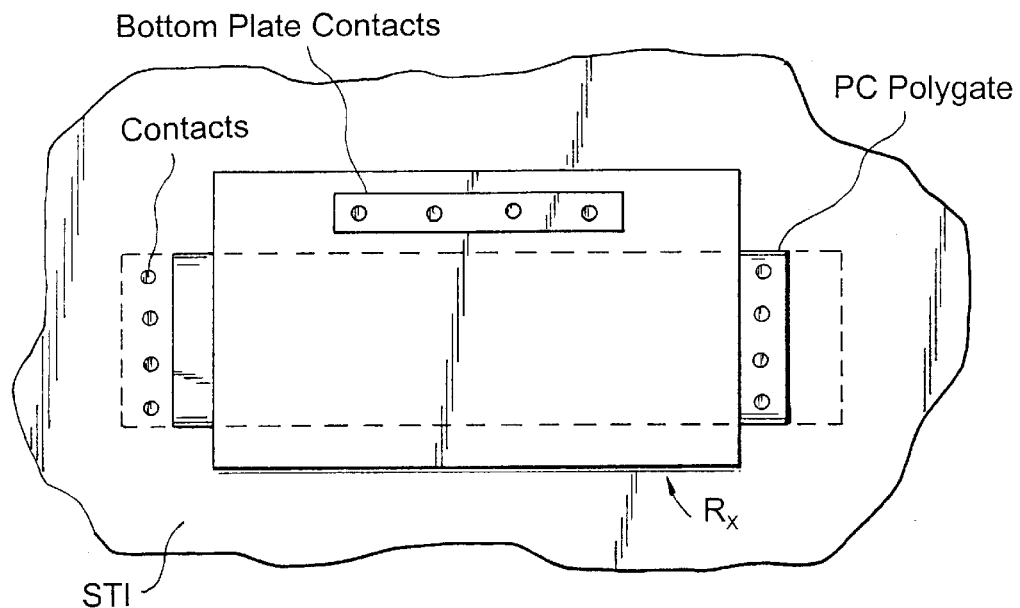
FIGS. 1(a)–(b) are top and side views, respectively, of a prior art MOSCAP device.
Figure 1B:
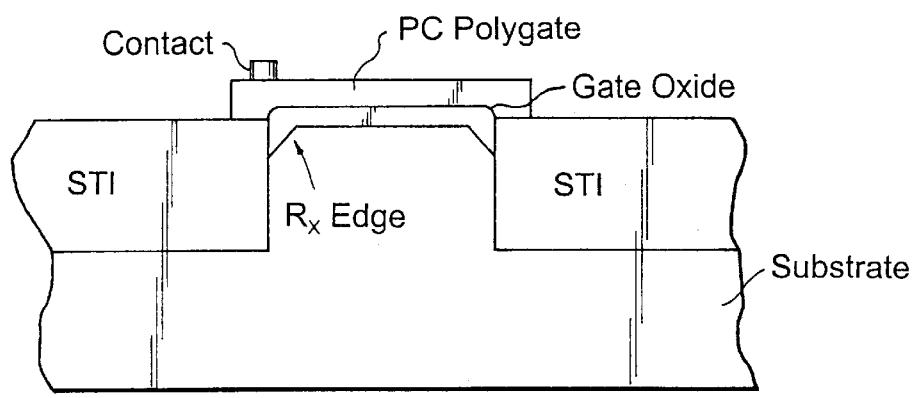

The present invention, which provides a reliable MOS device which exhibits little or no oxide breakdown at the $R_x$ edge as well as a method for fabricating the same, will now be described in greater detail by referring to the drawings that accompany this application. It should be noted that in the accompanying drawings like elements or corresponding components are referred to by like reference numerals.

Broadly speaking, the present invention provides a new MOS design which avoids the breakdown problem observed with prior art designs. Specifically, the MOS device of the present invention comprises a semiconducting substrate 10; a first doped region 12 formed in semiconducting substrate 10; a dielectric region formed on said first doped region, wherein said dielectric region includes a dielectric layer abutting a substantially thicker portion composed of a screen oxide 16 and a nitride pad 18; a gate region 22 formed over the dielectric region, said gate region 22 being doped with a n- or p-type dopant; and an electrical contact 24 connected directly to said gate region over the substantially thicker portion of said dielectric region.

Figure 3C:
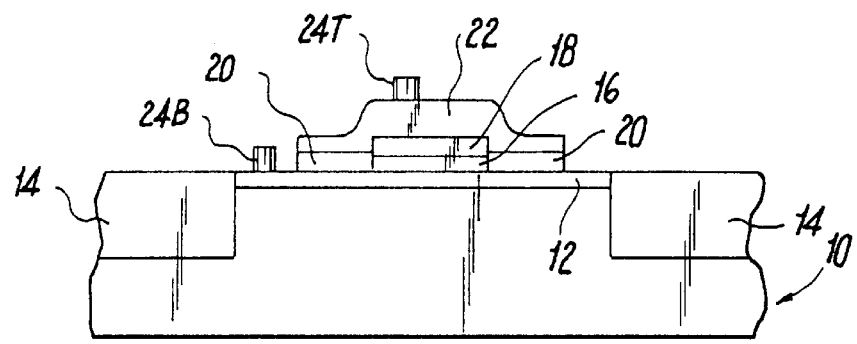
FIG. 3(c) is a side view of both devices.
Figure 4:
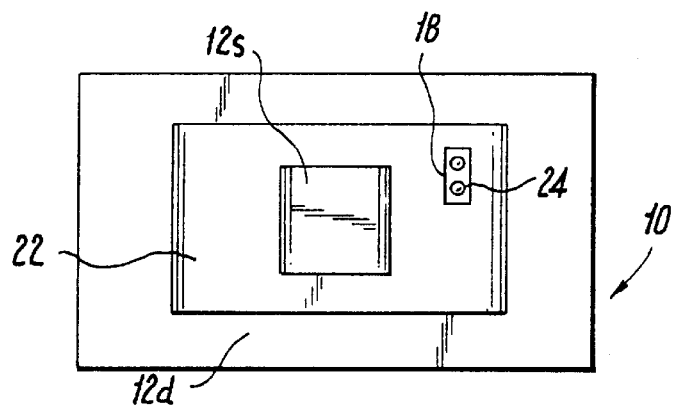
FIG. 4 is a top view of a FET device of the present invention.
Figure 5:
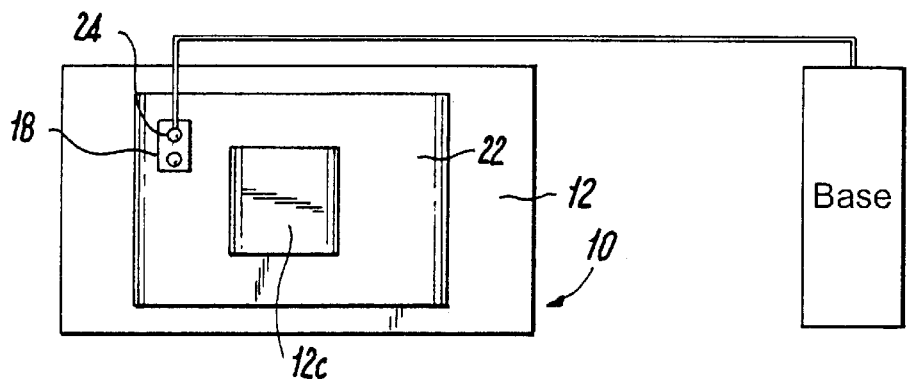
FIG. 5 is a top view of a lateral pnp device of the present invention.

Exemplary MOS devices of the present invention comprising the above components are shown in FIGS. 3(a)–(c), 4 and 5. Specifically, FIGS. 3(a)–(b) are top views of MOSCAP devices of the present invention; whereas FIG. 3(c) is a side view of the MOSCAP devices of FIGS. 3(a)–(b). In FIG. 3(b), the nitride pad is a rectangular shaped strip contained within the $R_x$ and under the gate region, while in FIG. 3(a), the nitride pad is square. FIG. 4 illustrates a top view of a FET device of the present invention and FIG. 5 illustrates a top view of a lateral pnp device of the present invention. Common to all these devices is that the active device regions are within the $R_x$ perimeter; therefore the devices of the present invention are more reliable than prior art devices since they exhibit little or no oxide breakdown at the $R_x$ edge.

In FIG. 3(c), region 12 represents the bottom plate of the capacitor and gate region 22 represents the top plate of the capacitor. As illustrated, the MOSCAP comprises a semiconducting substrate 10 having shallow trench isolation (STI) regions 14 therein. The lower plate, i.e. first doped region 12, of the capacitor is formed in areas abutting STI regions 14. The active device region, i.e. capacitor comprising dielectric layer 20, screen oxide 16, nitride pad 18 and doped gate region 22, is formed between the STI regions. Metal contacts 24T (top plate contact) and 24B (bottom plate contact) are shown connected to doped gate region 22 over the substantially thicker portion and to first doped region 12, respectively.

In FIG. 4, first doped region 12 comprises two distinct regions. These regions represent the source 12s/drain 12d regions of the FET device. The active device region comprising layers 20, 16, 18 and 22 is formed on portions of semiconducting substrate 10 between the source/drain regions.

In FIG. 5, region 12 comprises an emitter region 12e and a collector region 12c which are formed in semiconducting substrate 10. Above emitter region 12e is found the active device region of the device which comprises layers 20, 16, 18 and 22.

The process used in forming each of the above described CMOS devices will now be described in detail by referring to FIGS. 6(a)–(f). It should be noted that although reference is made to fabricating a MOSCAP device, the same basic steps apply in forming the other devices. The main difference being that instead of forming a single doped region 12 within semiconducting substrate 10, two distinct doped regions are formed using conventional processes well known to those skilled in the art.

Figure 6A:
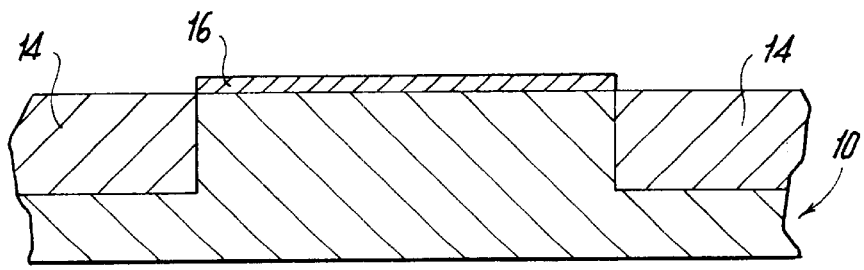
FIGS. 6(a)–(f) are cross-sectional views illustrating the process steps used in forming a MOSCAP device of the present invention.

Turning to FIG. 6(a), there is shown a semiconducting substrate 10 which contains STI regions 14 embedded therein as well as a screen oxide layer 16 which covers portions of semiconducting substrate 10 not containing the STI regions.

Semiconducting substrate 10 employed in the present invention comprises any semiconducting material including, but not limited to: Si, Ge, SiGe, SiCGe, Ga, GaAs, InAs, InP and all other III/V compounds. Of these semiconducting materials, it is highly preferred that semiconducting substrate 10 be composed of Si. The semiconducting material may be doped, undoped or contain doped and undoped regions.

The structure shown in FIG. 6(a) is fabricated using conventional processes well known to those skilled in the art. For example, STI regions 14 are fabricated using lithography and dry etching to provide a shallow trench region in the surface of semiconducting substrate 10. The shallow trench region is filled with a dielectric material such as tetraethylorthosilicate (TEOS) and densified. A liner material may optionally be formed in the trench prior to filling the trench with TEOS. The resist used in the lithography step is removed and thereafter the structure is planarized using conventional planarization processes such as reactive-ion etching (RIE), chemical-mechanical polishing (CMP) or grinding.

Screen oxide layer 16 is formed on the surface of semiconducting substrate 10 by using a thermal oxidation process which is capable of growing a thin oxide layer on the surface thereof. In accordance with the present invention, the screen oxide is used as an implantation mask in a subsequent implantation process. Alternatively, the screen oxide layer can be formed by patterning the structure with a suitable resist and then depositing an oxide-containing material such as $SiO_2$ on the exposed surface of semiconducting substrate 10 using conventional deposition techniques such as chemical vapor deposition (CVD), plasma enhanced CVD, sputtering and other like deposition processes.

Notwithstanding which technique is employed in forming the screen oxide layer, screen oxide layer 16 has a final thickness of from about 20 to about 200 Å. More preferably the final thickness of the screen oxide layer is from about 60 to about 100 Å.

Figure 6B:
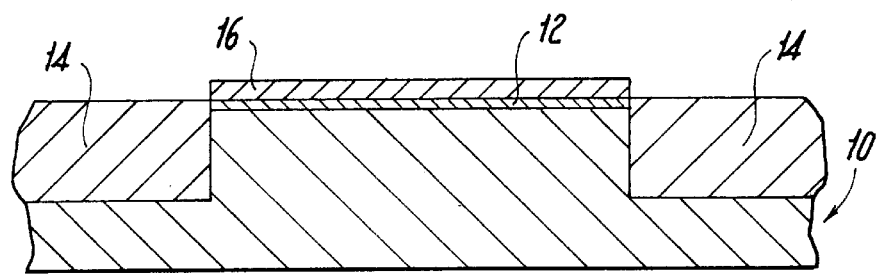
Figure 6C:
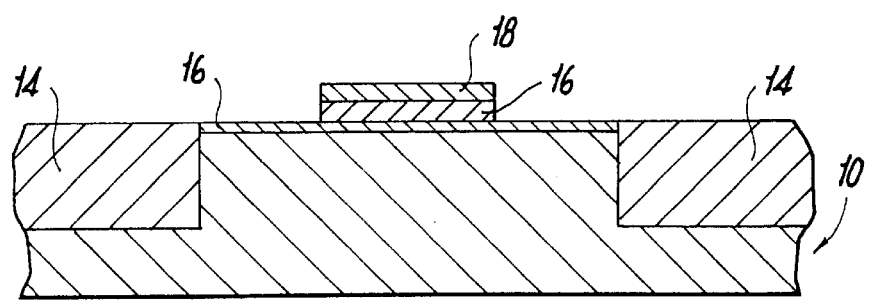
Figure 6D:
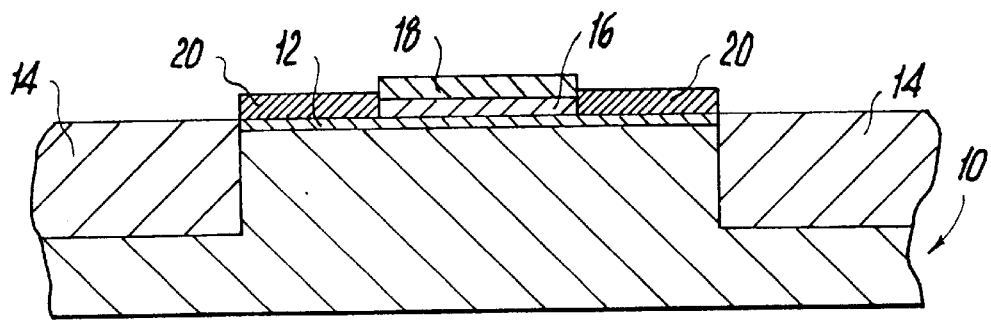
Figure 6E:
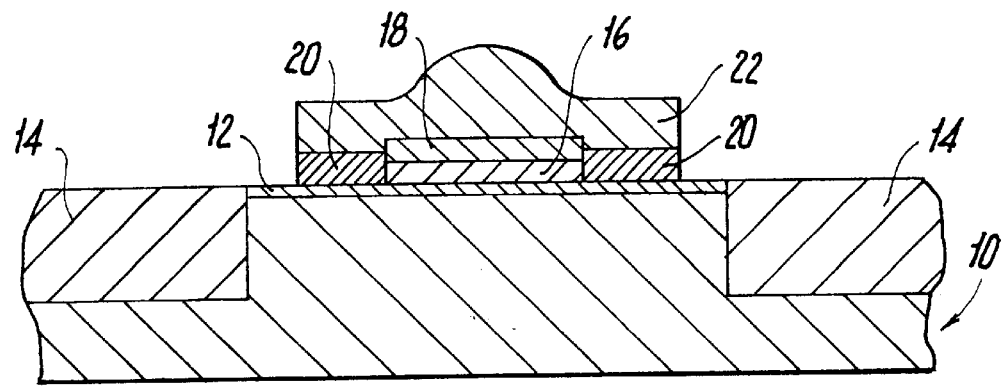
Figure 6F:
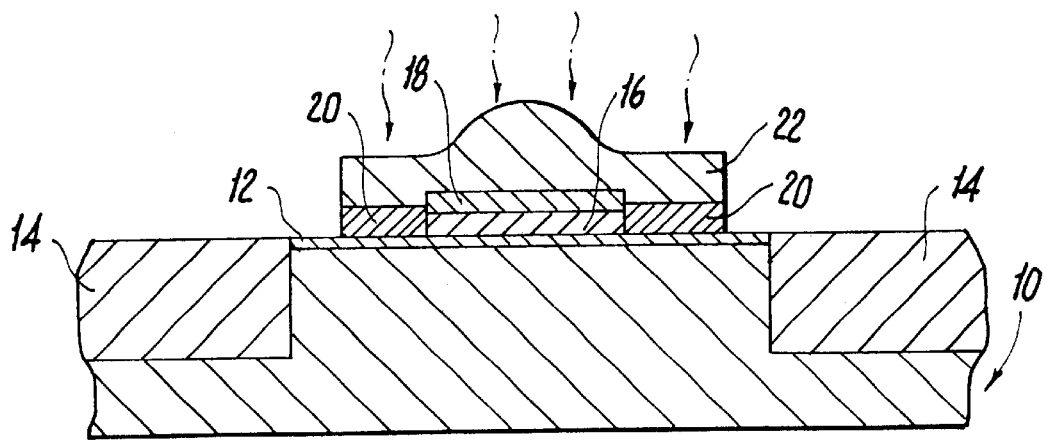

Next, as illustrated in FIG. 6(b), first doped region 12 is formed using conventional implantation techniques that are well known in the art. Although a single doped region is illustrated, it is also within the contemplation of the present invention to provide discrete doped regions in the surface of the semiconducting substrate. Such an embodiment is particularly useful when FET devices and pnp devices are being fabricated.

Ion implantation is carried out utilizing a conventional ion beam apparatus that is capable of operating at an energy of from about 5 to about 800 KeV and an ion dosage of from about $1 \times 10^2$ to about $1 \times 10^{21}$ atoms/cm$^2$. The ions are typically implanted to a depth of from about 5 to about 200 nm within the semiconducting substrate. N- or p-type dopant atoms can be implanted in the surface of semiconducting substrate 10.

After ion implantation, nitride pad layer 18 is formed on the surface of screen oxide 16 using conventional deposition processes well known to those skilled in the art including, but not limited to: CVD, plasma-enhanced CVD, sputtering and other like deposition processes. Suitable materials used in forming nitride pad layer 18 include: TiN, $Si_3N_4$ and TaN. In a highly preferred embodiment of the present invention, $Si_3N_4$ is used in forming the nitride pad layer. The thickness of the nitride pad formed in the present invention is from about 20 to about 1000 Å. More preferably, the thickness of the pad nitride layer is from about 500 to about 600 Å.

The nitride pad and screen oxide are then patterned and etched so as to leave a stack region of the same between the STI regions. Specifically, a conventional photoimageable resist is employed to pattern the nitride pad layer and the screen oxide layer and the patterned portions are removed using a conventional dry etching technique such as RIE or plasma etching. The structure containing the stack region of nitride pad 18 and screen oxide 16 is shown in FIG. 6(*c*).

Next, as shown in FIG. 6(*d*), a dielectric layer 20 is formed on portions of the semiconducting surface, not containing the STI regions, but abutting the stack region. The dielectric layer may be thermally grown using conventional thermal oxidation conditions well known in the art, or it can be deposited by conventional techniques such as CVD, plasma enhanced CVD, sputtering, spin-on coating and other like deposition techniques. Suitable dielectric materials that can be employed in the present invention are typical insulating materials including, but not limited to: oxides, nitrides, diamond, diamond-like carbon, paralene polymers, silicon polymers and other like materials. In a preferred embodiment of the present invention, the dielectric layer is a thermally grown oxide layer.

The thickness of the dielectric layer 20 abutting the stack region is typically of from about 30 to about 200 Å. More preferably, the thickness of dielectric layer 20 is from about 50 to about 100 Å. It should be noted herein that from now on dielectric layer 20 as well as layers 16 and 18 are referred to as a "dielectric region that has a substantially thicker portion." The thicker portion is formed of layers 16 and 18.

A gate material 22 is then formed on the entire structure shown in FIG. 6(*d*) and the gate region is patterned forming the structure shown in FIG. 6(*e*). Suitable gate materials employed in the present invention include: polysilicon; perovskite-type oxides such as barium strontium titanate; conductive metals, i.e. Pt, W, Cu, etc; and other like gate materials.

The gate material is formed on the structure using conventional deposition processes including, but not limited to: CVD, plasma enhanced CVD, sputtering, spin-on coating and like deposition processes. Patterning of the gate material is carried out using lithography and dry etching. It is noted that this patterning step also removes a portion of dielectric layer 20 thereby providing exposed regions for forming a contact with first doped region 12.

Before or after patterning the gate material, the patterned gate region of FIG. 6(*e*) is subjected to a second ion implantation step. Specifically, the gate material is usually heavily doped with a n- or p-type dopant. Examples of the same include: boron for p-type dopants and arsenic or phosphorous for n-type dopants. The structure containing doped gate region 22 is shown in FIG. 6(*f*). The area is cross-hatched to emphasize that it is now a doped region.

FIG. 3(*b*) represents the final steps employed in the present invention. As shown therein, electrical contacts 24 (T&B) are formed on doped gate region 22 over the substantially thicker portion, i.e. stack region, as well as on an exposed surface of semiconducting substrate 10. The electrical contacts are composed of a conductive material such as Al, Cu, W, Pt, Au, Pd and other like refractory metals. The contacts are formed using conventional lithography and deposition processes well known to those skilled in the art.

While the present invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new and desired to secure by the Letters Patent is:

1. A metal oxide semiconductor (MOS) device comprising:

a semiconducting substrate having at least two trench isolation regions formed therein, each trench isolation region having an $R_x$ edge;

a first doped region formed in said semiconducting substrate between said at least two trench isolation regions;

a dielectric region formed on said first doped region, wherein said dielectric region has a substantially thicker portion comprising a nitride pad having a thickness of from about 20 to about 1000 Å formed over a screen oxide, said dielectric region including said thicker portion is not present over each $R_x$ edge of said trench isolation regions;

a gate region formed over the dielectric region; and an electrical contact connected directly to said gate region over the substantially thicker portion of said dielectric region.

2. The MOS device of claim 1 wherein said semiconducting substrate is a semiconducting material selected from the group consisting of Si, Ge, SiGe, SiCGe, Ga, As, InAs, InP and other III/V compounds.

3. The MOS device of claim 2 wherein said semiconducting material is Si.

4. The MOS device of claim 1 further comprising an electrical contact formed on said semiconducting substrate.

5. The MOS device of claim 1 wherein said dielectric region includes a dielectric layer abutting said substantially thicker portion of said dielectric region.

6. The MOS device of claim 5 wherein said dielectric layer is composed of an insulating material selected from the group consisting of an oxide, a nitride, diamond, diamond-like carbon, a silicon polymer and a paralene polymer.

7. The MOS device of claim 6 wherein said dielectric layer is composed of $SiO_2$.

8. The MOS device of claim 1 wherein said device is a metal oxide semiconductor capacitor (MOSCAP), a field effect transistor (FET) or a bipolar transistor.

9. The MOS device of claim 1 wherein said nitride pad has a thickness of from about 500 to about 600 Å.

10. The MOS device of claim 1 wherein said screen oxide has a thickness of from about 20 to about 200 Å.

11. The MOS device of claim 10 wherein said screen oxide has a thickness of from about 60 to about 100 Å.

12. The MOS device of claim 1 wherein said gate region comprises a gate material selected from the group consisting of polysilicon, a perovskite-type oxide and a conductive metal.

13. The MOS device of claim 12 wherein said gate region is composed of polysilicon.

14. The MOS device of claim 1 wherein said electrical contact is composed of a conductive material selected from the group consisting of Al, Cu, Au, Pt, W and Pd.

15. A metal oxide semiconductor capacitor comprising:

a semiconducting substrate having at least two trench isolation regions formed therein, each trench isolation region having an $R_x$ edge;

first plate formed in said semiconducting substrate between said at least two trench isolation regions;

a dielectric region formed on said first plate, wherein said dielectric region has a substantially thicker portion comprising a nitride pad having a thickness of from about 20 to about 1000 Å formed over a screen oxide layer, said dielectric region including said thicker portion is not present over each $R_x$ edge of said trench isolation regions;

a gate region formed over said dielectric region and said substantially ticker portion; and an electrical contact connected directly to said gate region over the substanially thicker portion of said dielectric region.

* * * * *